(12) United States Patent
Greenstreet

(10) Patent No.: US 6,703,949 B2
(45) Date of Patent: Mar. 9, 2004

(54) METHOD AND APPARATUS FOR FACILITATING BALANCED BUNDLES OF ELECTRICAL SIGNALS

(75) Inventor: Mark R. Greenstreet, Vancouver (CA)

(73) Assignee: Sun Microsystems, Inc., Santa Clara, CA (US)

(*) Notice: Subject to any disclaimer, the term of this patent is extended or adjusted under 35 U.S.C. 154(b) by 15 days.

(21) Appl. No.: 10/156,159

(22) Filed: May 28, 2002

(65) Prior Publication Data

US 2003/0076246 A1 Apr. 24, 2003

Related U.S. Application Data

(60) Provisional application No. 60/328,546, filed on Oct. 11, 2001.

(51) Int. Cl.[7] .................................................. H03M 5/00
(52) U.S. Cl. ........................... 341/58; 341/50; 341/59
(58) Field of Search ............................. 341/50, 55, 57, 341/58, 59, 70, 73

(56) References Cited

U.S. PATENT DOCUMENTS

| | | | |
|---|---|---|---|
| 4,027,152 A | * 5/1977 | Brown et al. ................ 398/190 |
| 4,319,227 A | * 3/1982 | Malinowski et al. ......... 341/57 |
| 4,343,023 A | * 8/1982 | Nishimura et al. ........... 360/40 |
| 4,520,346 A | * 5/1985 | Shimada ...................... 341/58 |
| 5,198,813 A | * 3/1993 | Isozaki ........................ 341/59 |
| 5,387,911 A | * 2/1995 | Gleichert et al. ............ 341/95 |
| 5,828,326 A | * 10/1998 | Kikuchi ....................... 341/99 |
| 6,269,127 B1 | * 7/2001 | Richards ..................... 375/282 |

* cited by examiner

Primary Examiner—Michael Tokar
Assistant Examiner—Khai Nguyen
(74) Attorney, Agent, or Firm—Park, Vaughan & Fleming LLP

(57) ABSTRACT

One embodiment of the present invention provides a system that transmits a stream of datawords through a bundle of conductors with a three-dimensional structure. Upon receiving a dataword to be transmitted, the system uses an encoding function to encode the dataword into a current codeword in a stream of codewords, wherein the current codeword is less than double the size of the dataword. Next, the system transmits the current codeword to a destination through the bundle of conductors. Note that the encoding function depends on a preceding codeword in the stream of codewords, so that when the preceding codeword changes to the current codeword, rising transitions are substantially matched with falling transitions within the bundle.

28 Claims, 6 Drawing Sheets

| BUNDLE | PATTERN | #WORDS | DEGREE | BITS/SYM. | #WIRES | (BITS/SYM.)/WIRE |
|---|---|---|---|---|---|---|
| A | | 16 | 11 | 3.0 | 6 | 0.500 |
| B | | 23 | 17 | 4.0 | 7 | 0.571 |
| C | | 42 | 26 | 4.5 | 8 | 0.563 |
| D | | 80 | 36 | 5.0 | 9 | 0.556 |
| E | | 82 | 37 | 5.0 | 9 | 0.556 |
| F | | 112 | 65 | 6.0 | 10 | 0.600 |
| G | | 160 | 73 | 6.0 | 10 | 0.600 |
| H | | 306 | 157 | 7.0 | 12 | 0.583 |
| I | | 378 | 167 | 7.0 | 12 | 0.583 |
| J | | 410 | 165 | 7.0 | 12 | 0.583 |
| K | | 825 | 272 | 8.0 | 13 | 0.615 |
| L | | 1660 | 507 | 8.5 | 14 | 0.607 |
| M | | 2087 | 638 | 9.0 | 15 | 0.600 |
| N | | 3824 | 1202 | 9.5 | 16 | 0.594 |

FIG. 8

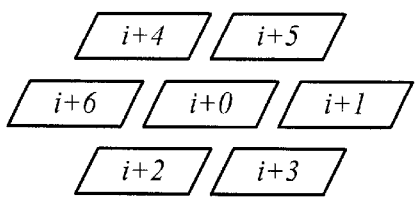
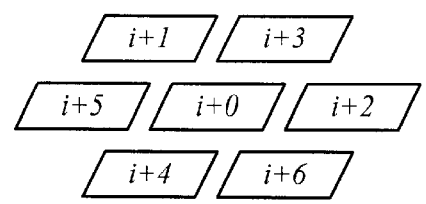
FIG. 9A  FIG. 9B
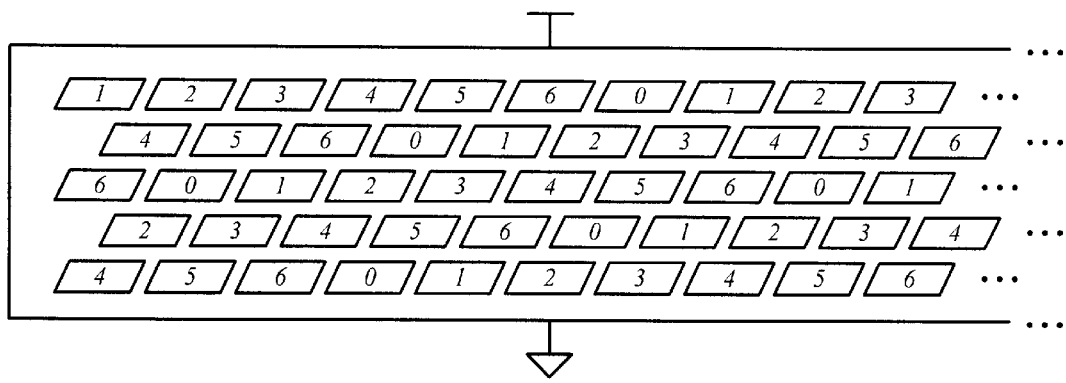
FIG. 10

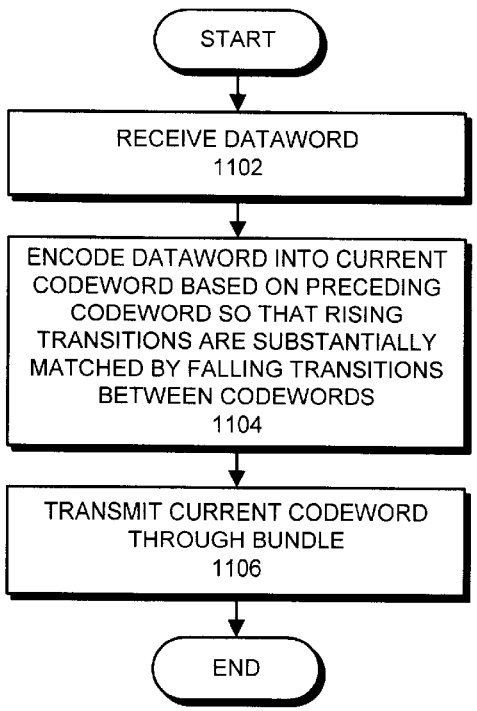
FIG. 11
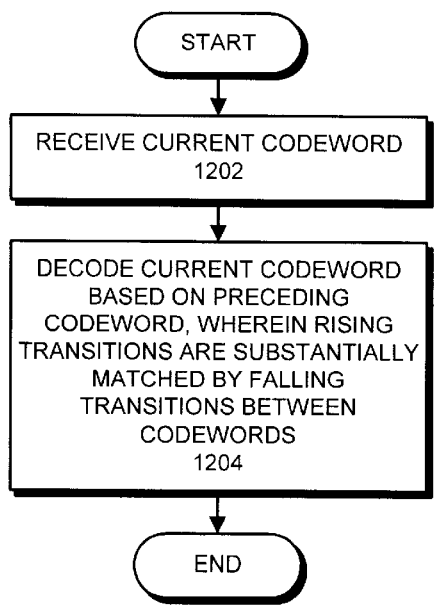
FIG. 12
```
int div3(int t, int k, int r) {
    int u = t;
    for(int i = 1; i < k; i++)
        u = u + (u << (1 << i));
    return((u+r) >> (1 << (1 << k)));
}
```
Where: $t = \in \{0 \ldots 2^{b+2} - 1\}$;
$k = \lceil \log_2(b + 2) \rceil$;
$r = 2^{2^k} \text{ div } 3$.
FIG. 13

METHOD AND APPARATUS FOR
FACILITATING BALANCED BUNDLES OF
ELECTRICAL SIGNALS

RELATED APPLICATION

This application hereby claims priority under 35 U.S.C. §119 to U.S. Provisional Patent Application No. 60/328,546, entitled "Balanced Bundles" by inventor Mark R. Greenstreet, filed on Oct. 11, 2001.

BACKGROUND

1. Field of the Invention

The present invention relates to techniques for transmitting electrical signals. More specifically, the present invention relates to a method and an apparatus for transmitting electrical signals through balanced bundles with a three-dimensional structure, wherein rising and falling transitions are substantially matched, and without doubling the number of signal lines as is done in conventional differential signaling.

2. Related Art

As processor clock speeds continue to increase at an exponential rate, data must be transferred at correspondingly faster rates between computer system components. Computer systems typically use large parallel busses for this purpose.

These large parallel busses typically use either single-ended signaling or differential signaling. Single-ended signaling makes use of a single signal line to carry each bit, along with one or more clock lines to latch the signals.

In contrast, differential signaling uses two signal lines to carry each bit, wherein the value of the bit is indicated by a voltage difference between the two signal lines. Because currents are balanced between power and ground rails, differential signaling reduces power supply noise and solves the problem of where return currents come from. Moreover, differential signaling is less sensitive to ground shifts between sender and receiver because differential signaling relies on voltage differences between pairs of signal lines, instead of relying on an absolute voltage level of a single signal line.

Unfortunately, differential signaling uses twice as many wires as single-ended signaling, which can greatly exacerbate pin limitation problems.

What is needed is a method and apparatus for transferring data between computer system components without the large number of signal lines required by differential signaling, and without the current balance and ground noise problems of single-ended signaling.

SUMMARY

One embodiment of the present invention provides a system that transmits a stream of datawords through a bundle of conductors with a three-dimensional structure. Upon receiving a dataword to be transmitted, the system uses an encoding function to encode the dataword into a current codeword in a stream of codewords, wherein the current codeword is less than double the size of the dataword. Next, the system transmits the current codeword to a destination through the bundle of conductors. Note that the encoding function depends on a preceding codeword in the stream of codewords, so that when the preceding codeword changes to the current codeword, rising transitions are substantially matched with falling transitions within the bundle.

In a variation on this embodiment, the encoding function ensures that each conductor with a rising transition matches a corresponding conductor with a falling transition. In a further variation, the encoding function ensures that matching conductors are adjacent to each other within a two-dimensional cross-section of the three-dimensional structure of the bundle. Typically, this cross-section is normal to the direction of signal propagation in the bundle.

In a variation on this embodiment, conductors in the bundle form a hexagonal mesh, wherein each conductor in the interior of the bundle is adjacent to six neighboring conductors.

In a variation on this embodiment, the encoding function ensures that the current codeword is different from the preceding codeword, whereby no clock signal needs to be forwarded with the current codeword.

In a variation on this embodiment, the bundle of conductors is adjacent to other bundles of conductors in a larger three-dimensional structure. In a further variation, adjacent bundles have staggered clock phases.

One embodiment of the present invention provides a system that decodes a stream of codewords received through a bundle of conductors with a three-dimensional structure. Upon receiving a current codeword in the stream of codewords, the system uses a decoding function to decode the current codeword to restore a corresponding dataword, wherein the current codeword is less than double the size of the dataword. This decoding function reverses a corresponding encoding function, wherein the encoding function for the dataword depends on a preceding codeword in the stream of codewords, so that when the preceding codeword changes to the current codeword, rising transitions are substantially matched with falling transitions within the bundle.

BRIEF DESCRIPTION OF THE FIGURES

FIG. 5A illustrates an allowed transition between codewords in accordance with an embodiment of the present invention.

FIG. 5B illustrates disallowed transition between codewords in accordance with an embodiment of the present invention.

FIG. 6 illustrates a code for a seven-wire bundle in accordance with an embodiment of the present invention.

FIG. 7A illustrates an exemplary codeword for a seven-wire bundle in accordance with an embodiment of the present invention.

FIG. 7B illustrates a set of successors of the exemplary codeword illustrated in FIG. 7A in accordance with an embodiment of the present invention.

FIG. 8 presents a table of properties for various bundles accordance with an embodiment of the present invention.

FIG. 9A illustrates a set of bundles with staggered clock phases in accordance with an embodiment of the present invention.

FIG. 9B illustrates another set of bundles with staggered clock phases in accordance with an embodiment of the present invention.

FIG. 10 illustrates a printed circuit board cross-section in accordance with an embodiment of the present invention.

FIG. 11 presents a flow chart illustrating the encoding process in accordance with an embodiment of the present invention.

FIG. 12 presents a flow chart illustrating the decoding process in accordance with an embodiment of the present invention.

FIG. 13 illustrates exemplary code for computing g(k)*t in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Transmitter and Receiver

Figure 1:
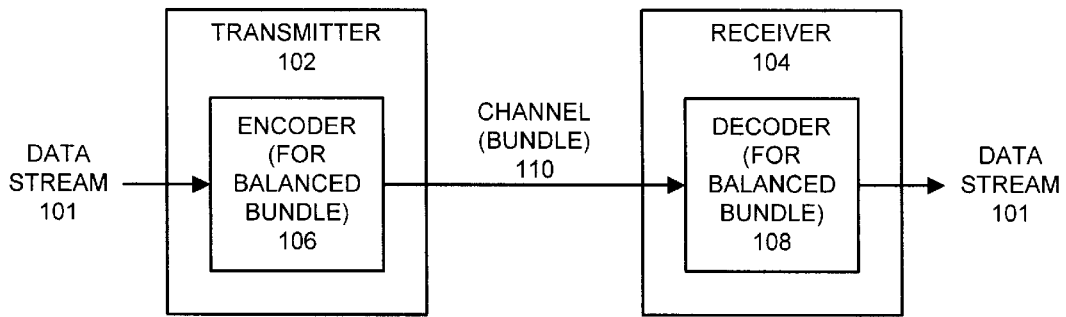
FIG. 1 illustrates a transmitter and a corresponding receiver in accordance with an embodiment of the present invention.

FIG. 1 illustrates a transmitter 102 and a corresponding receiver 104 in accordance with an embodiment of the present invention. Transmitter 102 receives a data stream 101 comprised of a sequence of data words. Transmitter 102 encodes these data words through encoder 106 to produce a corresponding stream of codewords that it feeds across channel 110 to receiver 104.

Receiver 104 decodes the stream of codewords through decoder 108 to restore data stream 101. Channel 110 comprises a "bundle" of conductors with three-dimensional structure, wherein the bundle has a two-dimensional cross-section normal to the direction of signal propagation in the bundle.

Note that encoder 106 and decoder 108 implement a "balanced" code wherein each transition between codewords involves a substantially equal number of rising and falling transitions.

Also note that the present invention can generally be applied to any situation in which multiple signal lines are used to transfer data. In one embodiment of the present invention, transmitter 102 and receiver 104 are located on different components of a digital system, such as a computer system. In another embodiment, transmitter 102 and receiver 104 are located on different computer systems.

Encoder

Figure 2:
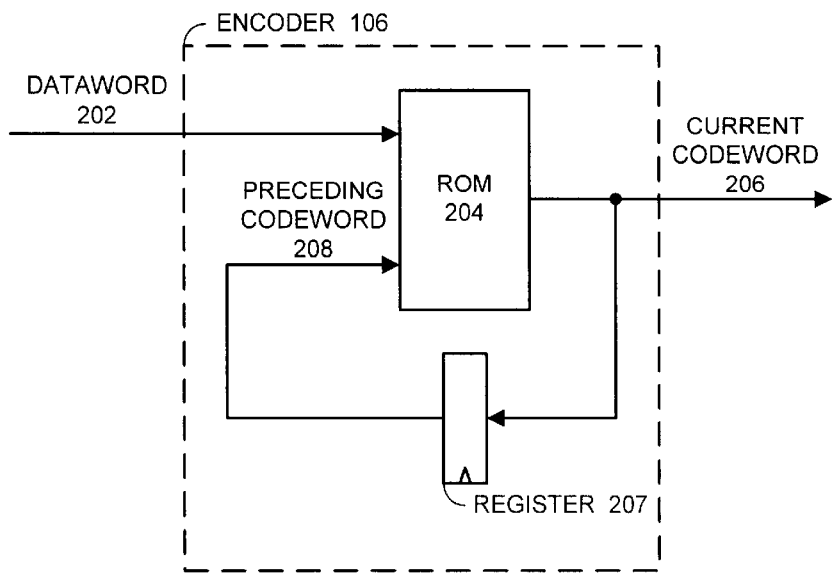
FIG. 2 illustrates the structure of an encoder in accordance with an embodiment of the present invention.

FIG. 2 illustrates the structure of encoder 106 in accordance with an embodiment of the present invention. Encoder 106 receives a dataword 202 from data stream 101, as well as a preceding codeword 208 from register 207. These two inputs feed into address inputs of a read only memory (ROM) to produce a current codeword 206 with balanced rising and falling transitions. Note that current codeword 206 is then stored in register 207 to be used in determining a subsequent codeword.

Also note that by programming ROM 204 appropriately, any possible function of dataword 202 and preceding codeword 208 can be implemented. Furthermore, although the present invention describes how to implement encoder 106 by using a ROM 204, any circuitry that implements an equivalent encoding function can be used in place of ROM 204.

Decoder

Figures 3, 4A, 4B:
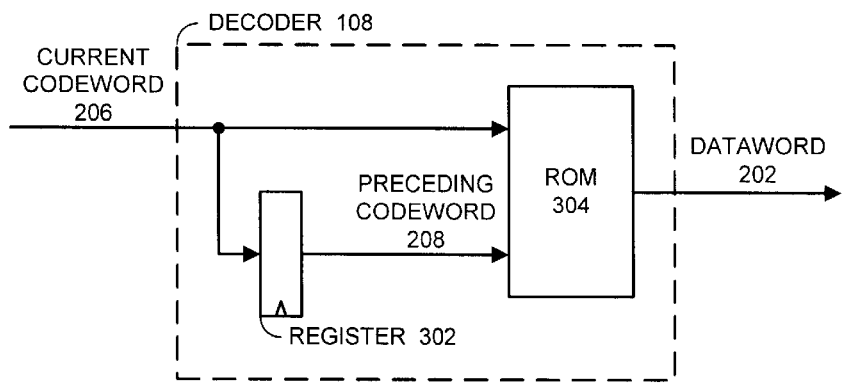
FIG. 3 illustrates the structure of a decoder in accordance with an embodiment of the present invention.
FIG. 4A illustrates a seven-wire bundle in accordance with an embodiment of the present invention.
FIG. 4B illustrates a set of possible codewords for a seven-wire bundle in accordance with an embodiment of the present invention.

FIG. 3 illustrates the structure of decoder 108 in accordance with an embodiment of the present invention. Decoder 108 receives a current codeword 206, which feeds into address inputs of ROM 304 as well as into register 302. Preceding codeword 208 from the output of register 302 feeds into other address inputs of ROM 304. The output of ROM 304 is decoded dataword 202. After dataword 202 is generated, register 302 stores current codeword 206 into register 302 to be used in decoding a subsequent codeword.

Although the present invention describes how to implement decoder 108 by using a ROM 304, any circuitry that implements an equivalent decoding function can be used in place of ROM 304.

Bundle Structure

Encoder 106 and decoder 108 implement one of a family of special balanced codes. These special balanced codes ensure that rising transitions are matched with adjacent falling transitions in the bundle of conductors 110 that transfers signals between encoder 106 and decoder 108.

To illustrate these codes, consider the seven-wire bundle, represented in FIG. 4A. One possible code that uses this seven-wire bundle has three wires high and four wires low in each code word. This code has $$\binom{7}{3} = 35$$

code words. Using a "+" character to denote a wire with a high level and a "−" character to denote a wire with a low level, seven example codewords in this code are illustrated in FIG. 4B.

Figures 5A, 5B, 6, 7A, 7B:
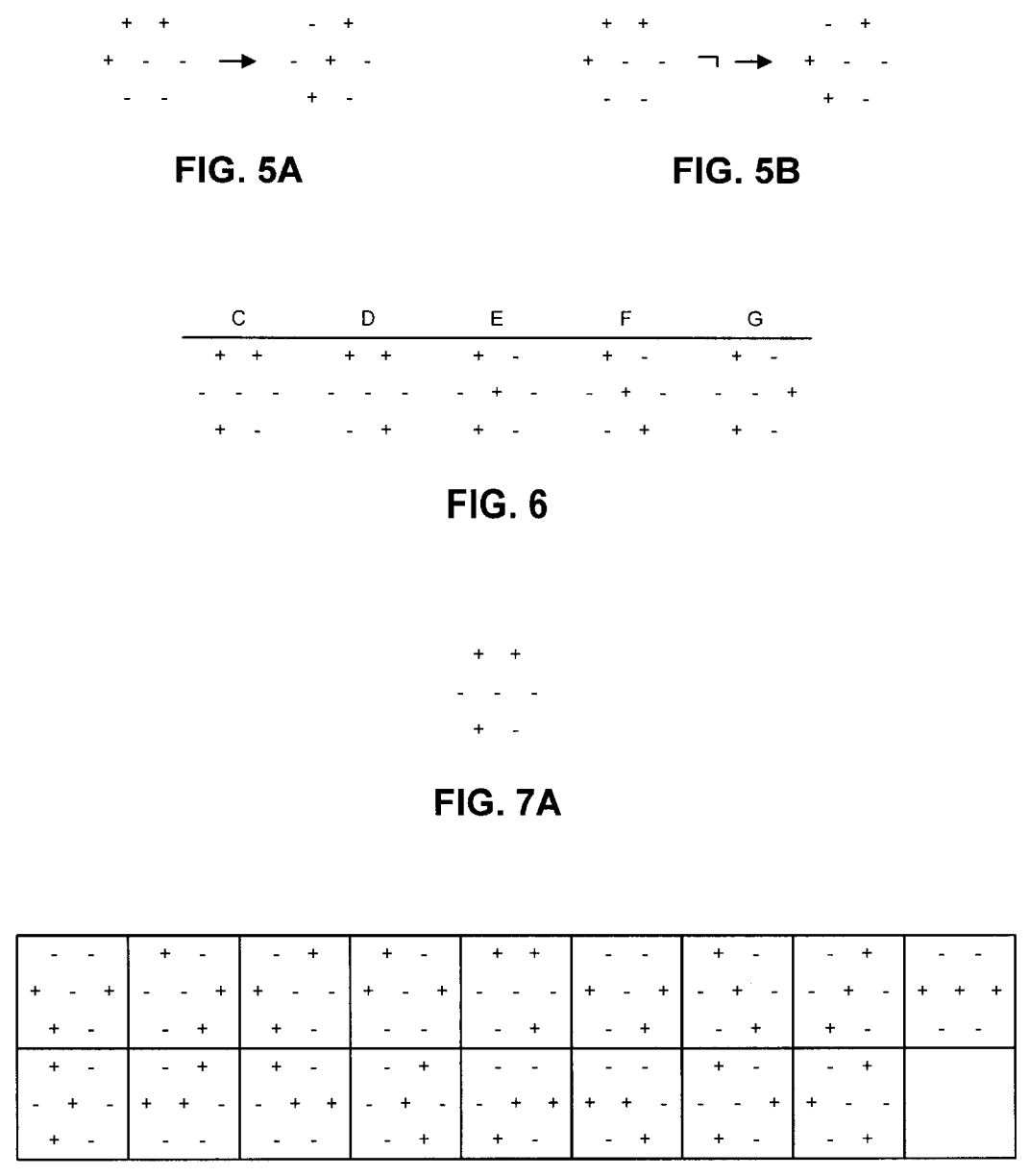

The other 28 codewords are formed by rotating these seven codewords: codewords A-E each have six unique rotations; codeword F has three unique rotations; and codeword G has two unique rotations. A transition between codewords is allowed if each rising wire can be paired uniquely with an adjacent falling wire. For example, the transition illustrated in FIG. 5A is allowed: pair wire 4 (rising) with wire 1 (falling); and pair wire 6 (rising) with wire 3 (falling). On the other hand, the transition illustrated in FIG. 5B is not allowed because wire 6 is the only rising wire and wire 1 is the only falling wire. These wires are not adjacent and therefore can't be paired.

Furthermore, we exclude transitions from a codeword to itself. Requiring that every pair of successive codewords be distinct eliminates the need to forward a clock with the code data.

Let X and Y be two codewords. We write X→Y to indicate that a transition from codeword X to codeword Y is allowed. The relation X→Y is reflexive: X→Y if and only if Y→X Because a codeword cannot transition to itself, this relation is irreflexive: X¬→X. Accordingly, the → relation is not transitive.

Computing Codes

This section presents a method of determining the maximum number of bits that can be conveyed with each transmission for a particular bundle. Let C be a code. If each codeword of C has at least n valid successors, then we can encode $\log_2 n$ bits of information with each codeword transition of C.

Let B be a bundle with w wires. We start by computing the set of codewords with $\lfloor w/2 \rfloor$ wires high. There are $$\binom{w}{w/2}$$

such codewords. For each pair of codewords, (X, Y), we construct a graph whose vertices correspond to the wires that rise or fall in a transition from X to Y. A vertex is "colored" rising if it corresponds to a rising wire and "falling" if it corresponds to a falling wire. There is an edge between the vertex for rising wire i and falling wire j if wires i and j are adjacent in the bundle. If this graph contains a bipartite matching, then X→Y.

Bipartite matching can be computed in polynomial time in the size of the graph. The number of bipartite matchings that must be tested is $$\binom{|C|}{2},$$

where |C| is the number of codewords of C.

Using Stirling's formula for factorials, $$|C| \approx \frac{\sqrt{2}}{\pi} \frac{2^n}{\sqrt{n}}.$$

Therefore, the number of bipartite matchings that must be tested is $O(2^{2n}/n)$. This grows rapidly with n, but is tractable for small bundles.

Having computed the set of all possible codewords and the transition relation over these, we set n to the smallest number of successors for any symbol. Then, we perform the following computation:

```
degree = 1;
while(at least one codeword remains) {
    eliminate all codewords with ≤ degree successors;
    degree++;
}
degree--;
```

Let d be the value of degree at the end of this computation. The set of codewords eliminated for the iteration with degree=d+1 all have at least d successors. Thus, these codewords form a code that can communicate $\log_2(d)$ bits per transition. Note that the code with degree=d must have at least d+1 codewords (because a codeword can't transition to itself). Typically, the code of degree d will have more than d+1 codewords.

For example, applying this algorithm to the seven-wire bundle from FIG. 4A yields the code consisting of the codewords illustrated in FIG. 6 and their rotations. This code has 23 distinct codewords where each codeword has at least 17 successors from among these 23.

For example, the 17 successors of the codeword illustrated in FIG. 7A are illustrated in FIG. 7B. Because every codeword has at least 17 successors, this code can communicate four bits per symbol.

Results

A program can be written to implement the computation described in the previous section and can be applied to various bundles. The table illustrated in FIG. 8 shows the results of such a program. For each bundle, this table shows an ASCII-art representation of the bundle, gives the degree of the code, the number of bits per symbol, the number of wires in the bundle, and the number of bits per symbol per wire. The last value is a measure of the efficiency of the code.

One can compute the degree, d, for each code as described in the previous section; every codeword in the final code has at least d successors. If $2^b \leq d < 1.5(2^b)$, then we list the code as conveying b bits per symbol. If $1.5*(2^b) \leq d < 2^{b+1}$, then we list the code as conveying b+0.5 bits per symbol; more specifically, 2*b+1 bits can be sent with two symbols. The last section of this specification presents the details.

Most of the bundles depicted the table in FIG. 8 can tile a plane. Therefore, they use a PC board efficiently. All bundles except for G, K, and L tile the plane. Bundle B, tiles the plane, but the tiling pattern is not axis aligned, leaving incomplete bundles on the boundaries.

With these observations, bundles C and F seem attractive for certain applications. Both bundles tile the plane, in simple patterns that only use two layers of the board. Bundle C has a small number of codewords, making encoding and decoding using look-up tables a practical option. Bundle F has a slightly larger number of codewords—look-up tables are probably still practical if some symmetries of the code are exploited. We are interested in finding a more systematic way to perform the encoding and decoding. Bundle F enjoys a fairly high coding efficiency (bits/symbol).

To put the coding efficiencies in perspective, a source-synchronous design conveys 12 bits per cycle using 14 wires (12 single data, and a differential clock). Using two bundles of type F conveys 12 bits using 20 wires, with balanced signaling. By contrast, using traditional differential pairs, a 12-bit slice requires 26 wires (2×12 wires for data and 2 wires for the forwarded, differential clock). For a 12-bit slice, the code for bundle F provides 30% greater signaling density than traditional differential signaling.

A common rule is that 80% of a chip's pins can be used for data signals if balanced signaling is used, and 60% with unbalanced signaling. Therefore, a source synchronous bus requires $$14/0.6 = 23\frac{1}{3} \text{ pins,}$$

whereas two bundles of type F require 20/0.8=25 pins. Given the electrical advantages of balanced signaling, it is likely that using bundles provides more bandwidth per pin than using unbalanced signaling. Furthermore, with unbalanced signaling, a ground or power plane is typically inserted between each pair of signal layers to provide shielding and return paths. With bundles, fewer planes should be required, providing a higher cross-section bandwidth at the PC board level.

Other Issues

This disclosure has shown how wires on can be laid out on a PC board such that cross-sections of the board have hexagonal cross-sections. This gives each wire six neighbors, compared with the two neighbors if only wires on the same layer are considered. The codes encode the clock as well as the data, and every rising signal is paired with a falling signal that provides the return path. The codes offer about 30% greater wiring utilization than traditional differential signaling, while preserving most of the electrical advantages of traditional differential approaches.

All of the codes shown here provide some out-of-band symbols. In other words, the codes have higher degree than required to send the number of bits in each symbol. These out-of-band symbols can be used by the system designer for diagnostic purposes, sending link control messages, etc. No extra wires are required to support such messages.

Note that exact balance of rising and falling transitions may not be required. Consider a bundle of 12 wires. If there is one more rising transition than falling, the imbalance in the return current can be distributed across the entire bundle, effectively putting the twelve inductors in parallel. If small imbalances like these can be tolerated, then it may be possible to send another bit (or half bit) per transition.

Finally, there is a possibility of coupling between adjacent bundles. As each bundle has an equal number of rising and falling signals for any transition, the coupling should be small, but there may be some residual dipole moment. This could be alleviated by staggering the clock phases on which bundles transition.

For example, using seven clock phases with bundle F from the table in FIG. 8, each bundle and its six neighbors all transition on distinct phases. FIGS. 9A and 9B shows two such arrangements, where each bundle is represented by a parallelogram depicting its outline, and labeled with the clock phase on which its signals transition, addition in the labels is modulo 7.

These are two possible staggerings—the one on the right may be slightly better because horizontally adjacent bundles don't transition on consecutive clock phases. Other patterns can be obtained by multiplying the phase offsets of either pattern by any integer in 1 . . . 6. Such staggerings could help mitigate the residual cross-talk while also reducing the simultaneous switching loads for the chip's output drivers.

FIG. 10 shows a possible PC board cross-section using bundles. This figure uses bundle F from the table illustrated in FIG. 8, and the staggering pattern from FIG. 9A. This board has a ground plane on the bottom, ten signal layers, and a power plane on the top. Assuming that wires are on an 8-mil pitch, the spacing between signal layers should be 6.93 mils. Assuming the same spacing to the power and ground planes gives a total board thickness of 76 mils, which should be manufacturable. The vertical extensions of the power and ground planes on the edges depict columns of vias to provide EMI shielding at the board's edges.

If the cross-section is 12 inches wide, then there can be 1500 wire tracks per layer. This is an overestimate as it does not include the space for vias (to bring signals into the bundles) or room for bundles turning corners, bundle crossings. Assuming 1000 wires per layer (which may be ridiculous), there can be up to 1000 bundles per board. If each bundle supports signaling at 2 GHz, then the board has a cross-section bandwidth of 1.5 terabytes/sec. If we've miss-estimated the routability, the figures can be adjusted accordingly. On the other hand, for short wires, we may be able to increase the signaling rate to 3–4 GHz.

Sending 2b+1 Bits with Two Symbols

Consider a code where each codeword has at least $1.5 \ast 2^b$ successors. To send a symbol in $s \in \{0 \ldots 2^{b+1}\}$, we represent s as a two digit number, base $3 \ast 2^{b-1}$. Let $s_0$ and $s_1$ represent these digits with $$s_0 = s \bmod (3 \ast 2^{b-1}), \text{ least significant digit} \qquad (2)$$

$$s_1 = s \operatorname{div} (3 \ast 2^{b-1}), \text{ least significant digit}$$

Where $x \operatorname{div} y = \lfloor x/y \rfloor$ and $x \bmod y = x - (x \operatorname{div} y) \ast y$. The digits $s_0$ and $s_1$ can each be sent with a single symbol in the code. When the digits are received, the original value can be reconstructed using the formula:

$$s = 3 \ast 2^{b-1} \ast s_1 + s_0 \qquad (3)$$

In this section, we show that the operations for computing $s_0$ and $s_1$ from s and vice-versa can each be performed with a small number of additions.

First, consider the computation of $s_0$ and $s_1$ from s. Observe $$s_0 = s \bmod (3 \ast 2^{b-1}), \text{ from eq. (2)} \qquad (4)$$

$$= (s \bmod 2^{b-1}) + ((s \operatorname{div} 2^{b-1}) \bmod 3) \ast 2^{b-1}$$

$$s_1 = s \operatorname{div} (3 \ast 2^{b-1})$$

$$= (s \operatorname{div} 2^{b-1}) \operatorname{div} 3$$

Because $s \in \{0 \ldots 2^{2b+1} - 1\}$, (i.e. $s \geq 0$), $s \bmod 2^{b-1}$ can be computed by selecting the b−1 least significant bits of s and $s \operatorname{div} 2^{b-1}$ can be computed by selecting the b+2 most significant bits of s.

FIG. 13 illustrates a procedure for computing t div 3 using $\log_2(b+2)$ additions. Let d=t div 3. Two more additions suffice to compute t mod 3:

$$t \bmod 3 = t - (d + (d \ll 1)) \qquad (5)$$

The reconstruction of s from $s_0$ and $s_1$ can be performed with two additions of b+1 bit words as shown below:

$$s = s_0 + ((s_1 + (s_1 \ll 1)) \ll (b-1)) \qquad (6)$$

We now present an example. Consider bundle C from the table illustrated in FIG. 8. Let s be a nine-bit quantity. To send s on this bundle, it is broken into two words, $s_0$ and $s_1$ as shown below:

b=4

$k = \lceil \log_2(b+2) \rceil = 3$ $r = 2^{2^k} \operatorname{div} 3 = 85$ $u_0 = (s > (b-1))$ $u_1 = (u_0 + (u_0 \ll 2))$ $s_1 = (u_2 > 8)$ $$s_0 = s - ((s_1 + (s_1 \ll 1)) \ll (b-1)) \qquad (6)$$

Note that b, k, and r are constants that can be computed in advance. Also, $3 \ast 2^{b-1} = 24$ is the base in which $s_0$ and $s_1$ are digits. Thus, a total of four additions are required to compute $s_0$ and $s_1$. For example, if s=371, then $u_0$=46, $u_1$=230, and $u_2$=3910. This yields $s_1$=15=(371 div 24), and $s_1$=11=(371 mod 24). After transmitting $s_0$ and $s_1$, the original value of s can be reconstructed with two additions using equation (6).

A note on efficiency. In the above process, we compute $s_0$ by the relation $s_0 = s - 3 \ast s_1$. There is enough information in $(g(k) \ast t) + r) \bmod 2^{2^k}$ to determine $s_0$. If $b < 2^k$, then a lower value can be chosen for r than the one used above, and $s_0$ can be determined from just a few bits of $(g(k) \ast t) + r) \bmod 2^{2^k}$. This may be faster and simpler than the method presented here. We have omitted the details for brevity.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for transmitting a dataword through a bundle of conductors with a three-dimensional structure, comprising:
   receiving the dataword to be transmitted;
   using an encoding function to encode the dataword into a current codeword in a stream of codewords, wherein the current codeword is less than double the size of the dataword; and
   transmitting the current codeword to a destination through the bundle of conductors;
   wherein the encoding function depends on a preceding codeword in the stream of codewords, so that when the preceding codeword changes to the current codeword, rising transitions are substantially matched with falling transitions within the bundle.

2. The method of claim 1, wherein the encoding function ensures that each conductor with a rising transition matches a corresponding conductor with a falling transition.

3. The method of claim 2, wherein the encoding function ensures that matching conductors are adjacent to each other within a two-dimensional cross-section of the three-dimensional structure of the bundle.

4. The method of claim 1, wherein conductors in the bundle form a hexagonal mesh, wherein each conductor in the interior of the bundle is adjacent to six neighboring conductors.

5. The method of claim 1, wherein the encoding function ensures that the current codeword is different from the preceding codeword, whereby no clock signal needs to be forwarded with the current codeword.

6. The method of claim 1, wherein the bundle of conductors is adjacent to other bundles of conductors in a larger three-dimensional structure.

7. The method of claim 6, wherein adjacent bundles have staggered clock phases.

8. A method for decoding a stream of codewords received through a bundle of conductors with a three-dimensional structure, comprising:
   receiving a current codeword in the stream of codewords through the bundle of conductors; and
   using a decoding function to decode the current codeword to restore the dataword, wherein the current codeword is less than double the size of the dataword;
   wherein the decoding function reverses a corresponding encoding function;
   wherein the encoding function for the dataword depends on a preceding codeword in the stream of codewords, so that when the preceding codeword changes to the current codeword, rising transitions are substantially matched with falling transitions within the bundle.

9. The method of claim 8, wherein the encoding function ensures that each conductor with a rising transition matches a corresponding conductor with a falling transition.

10. The method of claim 9, wherein the encoding function ensures that matching conductors are adjacent to each other within a two-dimensional cross-section of three-dimensional structure of the bundle.

11. The method of claim 8, wherein conductors in the bundle form a hexagonal mesh, wherein each conductor in the interior of the bundle is adjacent to six neighboring conductors.

12. The method of claim 8, wherein the encoding function ensures that the current codeword is different from the preceding codeword, whereby no clock signal needs to be forwarded with the current codeword.

13. The method of claim 8, wherein the bundle of conductors is adjacent to other bundles of conductors in a larger three-dimensional structure.

14. The method of claim 13, wherein adjacent bundles have staggered clock phases.

15. An apparatus that transmits a dataword through a bundle of conductors with a three-dimensional structure, comprising:
   an input that receives the dataword to be transmitted;
   an encoder that encodes the dataword into a current codeword in a stream of codewords, wherein the current codeword is less than double the size of the dataword; and
   a transmitter that transmits the current codeword to a destination through the bundle of conductors;
   wherein the encoder uses an encoding function that depends on a preceding codeword in the stream of codewords, so that when the preceding codeword changes to the current codeword, rising transitions are substantially matched with falling transitions within the bundle.

16. The apparatus of claim 15, wherein the encoding function ensures that each conductor with a rising transition matches a corresponding conductor with a falling transition.

17. The apparatus of claim 16, wherein the encoding function ensures that matching conductors are adjacent to each other within a two-dimensional cross-section of the three-dimensional structure of the bundle.

18. The apparatus of claim 15, wherein conductors in the bundle form a hexagonal mesh, wherein each conductor in the interior of the bundle is adjacent to six neighboring conductors.

19. The apparatus of claim 15, wherein the encoding function ensures that the current codeword is different from the preceding codeword, whereby no clock signal needs to be forwarded with the current codeword.

20. The apparatus of claim 15, wherein the bundle of conductors is adjacent to other bundles of conductors in a larger three-dimensional structure.

21. The apparatus of claim 20, wherein adjacent bundles have staggered clock phases.

22. An apparatus that decodes a stream of codewords received through a bundle of conductors with a three-dimensional structure, comprising:
   an input that receives a current codeword in the stream of codewords from the bundle of conductors; and
   a decoder that decodes the current codeword to restore the dataword, wherein the current codeword is less than double the size of the dataword;
   wherein the decoder reverses a corresponding encoding function;
   wherein the encoding function for the dataword depends on a preceding codeword in the stream of codewords, so that when the preceding codeword changes to the current codeword, rising transitions are substantially matched with falling transitions within the bundle.

23. The apparatus of claim 22, wherein the encoding function ensures that each conductor with a rising transition matches a corresponding conductor with a falling transition.

24. The apparatus of claim 23, wherein the encoding function ensures that matching conductors are adjacent to each other within a two-dimensional cross-section of the three-dimensional structure of the bundle.

25. The apparatus of claim 22, wherein conductors in the bundle form a hexagonal mesh, wherein each conductor in the interior of the bundle is adjacent to six neighboring conductors.

26. The apparatus of claim 22, wherein the encoding function ensures that the current codeword is different from the preceding codeword, whereby no clock signal needs to be forwarded with the current codeword.

27. The apparatus of claim 22, wherein the bundle of conductors is adjacent to other bundles of conductors in a larger three-dimensional structure.

28. The apparatus of claim 27, wherein adjacent bundles have staggered clock phases.

* * * * *